(12) United States Patent
Kobata et al.

(10) Patent No.: US 10,868,548 B2
(45) Date of Patent: Dec. 15, 2020

(54) PLL DEVICE

(71) Applicant: NIHON DEMPA KOGYO CO., LTD., Tokyo (JP)

(72) Inventors: Tsukasa Kobata, Saitama (JP); Kazuo Akaike, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 16/854,928

(22) Filed: Apr. 22, 2020

(65) Prior Publication Data

US 2020/0343895 A1    Oct. 29, 2020

(30) Foreign Application Priority Data

Apr. 23, 2019  (JP) ................. 2019-082083

(51) Int. Cl.
| | |
|---|---|
| *H03L 7/087* | (2006.01) |
| *H03L 7/091* | (2006.01) |
| *H03L 7/093* | (2006.01) |
| *H03L 7/189* | (2006.01) |
| *H03L 7/099* | (2006.01) |

(52) U.S. Cl.
CPC .............. *H03L 7/093* (2013.01); *H03L 7/099* (2013.01); *H03L 7/189* (2013.01)

(58) Field of Classification Search
CPC combination set(s) only.
See application file for complete search history.

(56) References Cited

U.S. PATENT DOCUMENTS 7,619,466 B2 *  11/2009  Oishi .................. H04L 27/233
                                                  329/304
10,585,169 B2 *  3/2020  Higuchi ................ G01S 7/40

FOREIGN PATENT DOCUMENTS

JP          2007074291         3/2007

* cited by examiner

*Primary Examiner* — An T Luu
(74) *Attorney, Agent, or Firm* — JCIPRNET

(57) ABSTRACT

A PLL device includes a voltage control oscillation unit, an analog/digital converter, a quadrature demodulation unit, a comparison signal output unit, a phase difference detection unit, a loop filter, and a digital/analog converter. The quadrature demodulation unit quadrature-demodulates the digital feedback signal to obtain an in-phase component (I component) and a quadrature-phase component (Q component). The comparison signal has a set frequency of the output signal when the feedback signal is the output signal and has a frequency obtained by dividing the set frequency by the dividing number when the feedback signal is the frequency division signal. The phase difference detection unit obtains a phase difference between the digital feedback signal and the digital comparison signal based on the I component and the Q component of the digital feedback signal and the I component and an Q component of a comparison signal.

10 Claims, 3 Drawing Sheets

US 10,868,548 B2

PLL DEVICE

CROSS-REFERENCE TO RELATED APPLICATIONS

This application is based on and claims priority under 35 U.S.C. § 119 to Japanese Patent Application No. 2019-082083, filed on Apr. 23, 2019, the entire content of which is incorporated herein by reference.

TECHNICAL FIELD

This disclosure relates to a technique that outputs a frequency signal with low phase noise.

DESCRIPTION OF THE RELATED ART

As a technique that stabilizes a frequency signal output from a voltage controlled oscillator (VCO), there has been known a phased locked loop (PLL) device. The PLL device compares phases between a frequency signal that is output from the VCO and divided as necessary and a stable reference frequency signal and adjusts a control voltage of the VCO corresponding to its phase difference to obtain a stable frequency signal.

For example, for a test signal source of a station oscillating unit and radio communication equipment at a mobile station, broadcasting equipment, and the like, a standard signal generator, such as a frequency synthesizer, is used, and the PLL device is made available for such equipment. Generally in the communication field, in order to avoid interference with other channels, it is required to have little noise. In particular, under a condition where radio waves are overcrowded as in recent years, the PLL device with little noise and high frequency stability is desired.

Here, in Japanese Unexamined Patent Application Publication No. 2007-74291, a frequency synthesizer is disclosed. The frequency synthesizer performs a quadrature detection with a sine wave signal having a frequency of $\omega 0/2\pi$ (after converting a frequency signal output from the VCO into a digital form, and extracts a rotational vector that corresponds to a frequency difference of these signals and is represented in complex notation. With this frequency synthesizer, a control voltage of the VCO is adjusted based on the difference value between a rotational vector frequency calculated corresponding to a set output frequency of the VCO and a rotational vector frequency actually obtained.

However, this technique is not a technique that focuses on suppression of phase noise of a frequency signal output from the PLL device.

A need thus exists for a PLL device which is not susceptible to the drawback mentioned above.

SUMMARY

According to an aspect of this disclosure, there is provided a PLL device that includes a voltage control oscillation unit, an analog/digital converter, a quadrature demodulation unit, a comparison signal output unit, a phase difference detection unit, a loop filter, and a digital/analog converter. The voltage control oscillation unit oscillates an output signal in an analog form which has a frequency corresponding to a control voltage. The analog/digital converter converts the output signal or a frequency division signal obtained by dividing the output signal by a preset dividing number as a feedback signal into a digital feedback signal. The quadrature demodulation unit quadrature-demodulates the digital feedback signal to obtain an in-phase component that is an I component and a quadrature-phase component that is a Q component. The comparison signal output unit outputs an I component and a Q component of a digital comparison signal. The digital comparison signal has a set frequency of the output signal when the feedback signal is the output signal and has a frequency obtained by dividing the set frequency by the dividing number when the feedback signal is the frequency division signal. The phase difference detection unit obtains a phase difference between the digital feedback signal and the digital comparison signal based on the I component and the Q component of the digital feedback signal and the I component and the Q component of the digital comparison signal. The loop filter outputs a control voltage value corresponding to the phase difference obtained at the phase difference detection unit. The digital/analog converter performs a digital-to-analog conversion on the control voltage value obtained at the loop filter and supplies an analog-converted value as a control voltage to the voltage control oscillation unit.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Figure 1:
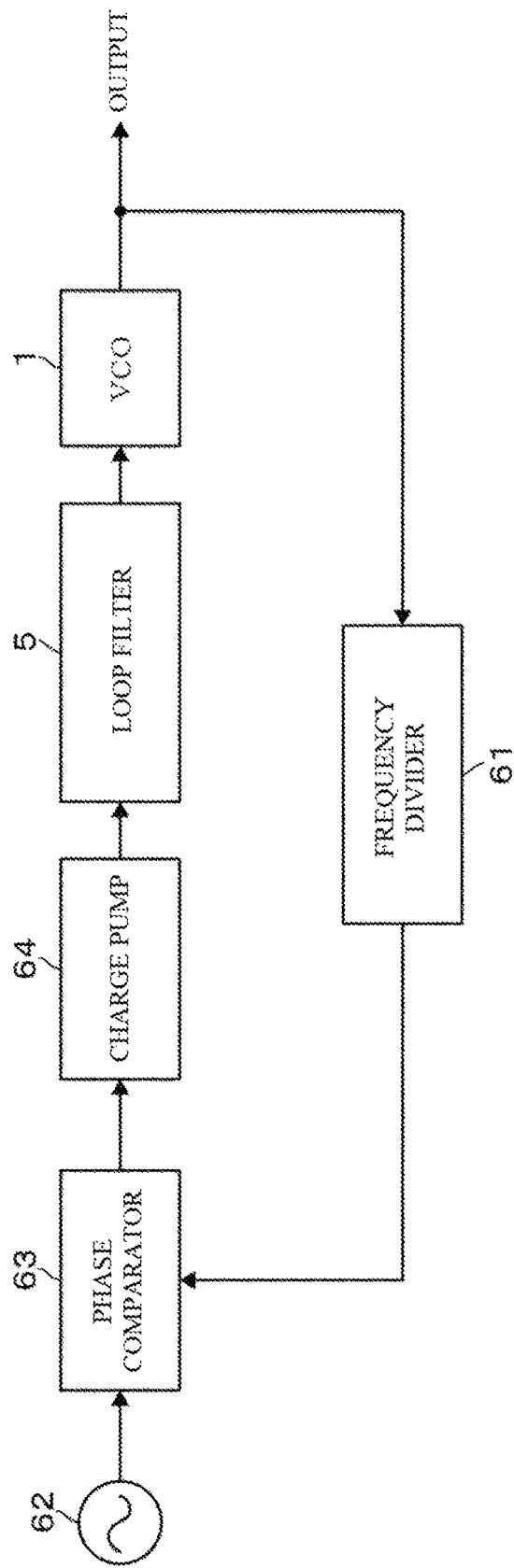
FIG. 1 is a block diagram illustrating a conventional PLL device.

Firstly, a problem that a conventional analog PLL device has in terms of a phase noise characteristic will be described with reference to FIG. 1.

A VCO 1 outputs an output signal as a frequency signal toward an outside and a frequency divider 61. The frequency signal divided by N at the frequency divider 61 is input as a feedback signal into a phase comparator 63 and compares a phase with a reference signal supplied from an external reference signal source 62. The phase comparator 63 outputs a signal having a pulse width corresponding to the phase difference, and a charge pump 64 outputs a pulse signal having an average current or an average voltage corresponding to the pulse width. A loop filter 5 averages the pulse signal output from the charge pump 64 and supplies a control voltage corresponding to the phase difference to the VCO 1.

Figure 3:
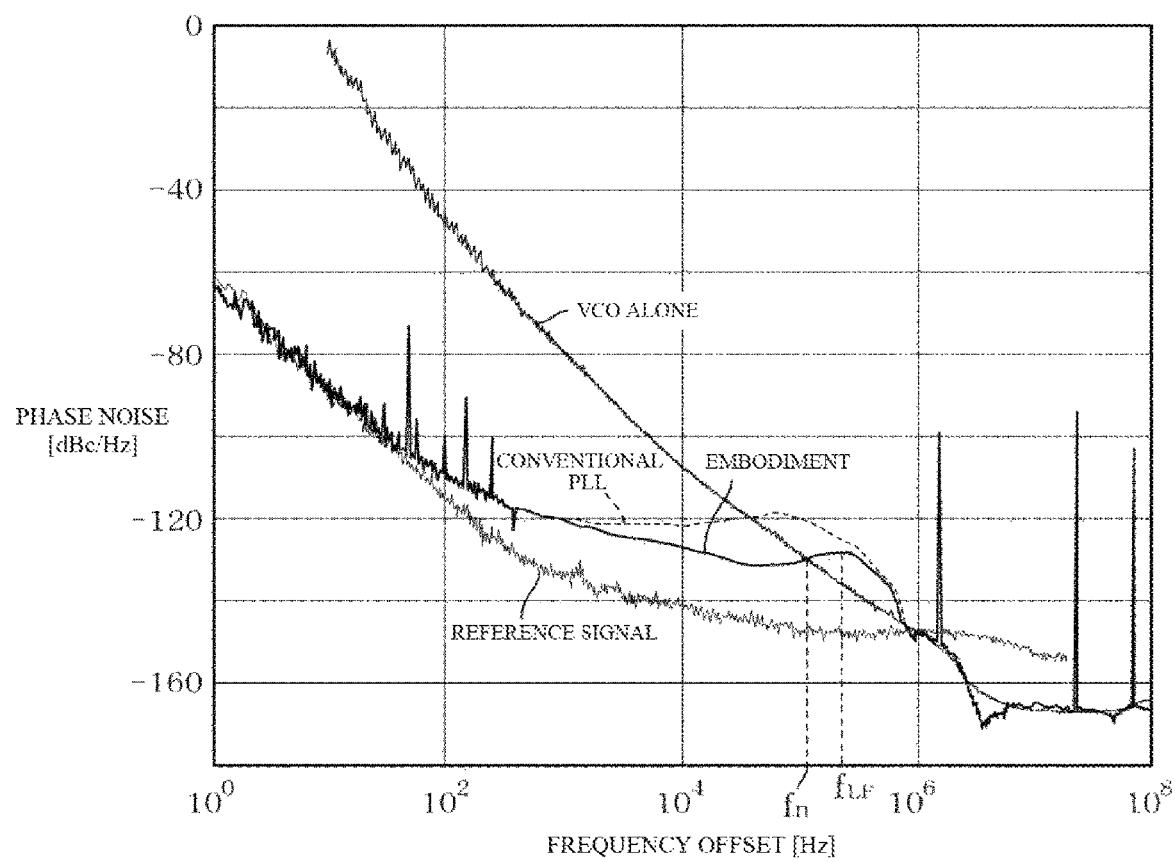
FIG. 3 is a characteristic diagram of phase noise according to the above PLL devices.

In the PLL device that has the above-described configuration, as illustrated in FIG. 3 by an example, a phase noise characteristic of the VCO 1 alone has an inclination gradually becoming gently with an increase in the frequency difference (frequency offset) from a position near a carrier frequency (950 MHz for this example) as a set frequency, and afterward, becomes to have a floor noise.

The PLL device synchronizes the phase of the feedback signal obtained by dividing the output signal of the VCO 1 with the phase of the reference signal, and this allows for obtaining a stable frequency signal with a suppressed phase noise.

According to the principle of the above-described PLL device, when the reference signal having the phase noise sufficiently lower than the VCO 1 is used, it appears that an output frequency with high quality in which the phase noise characteristic corresponds to the reference signal is obtained. However, the phase noise of the actual output frequency is influenced by the phase noise caused by respective equipment constituting the PLL device.

Note that, while a center frequency of the reference signal is 270 MHz in the example illustrated in FIG. 3, the characteristic in which the center frequency is converted into 950 MHz is illustrated in the same drawing.

Here, a relation of the following formula (1) is established between two indexes of a transient response characteristic of the PLL device, which include a dumping factor $\zeta$, and a natural frequency $f_n$, and a cutoff frequency $f_{LF}$ of the loop filter 5.

$$f_n = f_{LF}/(2\zeta) \qquad (1)$$

Further, the natural frequency $f_n$ is expressed in the following formula (2).

$$f_n = \{(Kp \cdot Kv)/(N \cdot A)\}^{0.5}/(2\pi) \qquad (2)$$

Kp is a gain of the phase comparator 63, Kv is a gain of the VCO 1, N is a dividing number of the frequency divider 61, and A is a constant determined by the loop filter 5.

Since the dumping factor $\zeta$ is usually set to be approximately 0.7, the natural frequency $f_n$ is lower than the cutoff frequency $f_{LF}$ of the loop filter 5 according to (1). Accordingly, a range of the frequency difference from the carrier frequency to the natural frequency can be said to be a region where the phase noise is suppressed to the same degree as the reference signal by the operation of the PLL device.

However, in the PLL device with the conventional configuration, as illustrated with a dashed line in FIG. 3, as the frequency difference increases, an effect of suppressing the phase noise against the output frequency of the PLL device gradually decreases, and afterward, the phase noise becomes approximately constant (approximately −120 dBc/Hz for the example in FIG. 3).

The inventor has identified that main factors of an increase from the phase noise of the reference signal are caused by the phase noise (20 log (10 N), N is the dividing number) generated corresponding to the dividing number of the frequency divider 61, a noise power generated at the phase comparator 63 and the charge pump 64, and a noise power of the VCO 1 after a suppression by the PLL device. It has been found that among these, the noise power at the phase comparator 63 and the charge pump 64 is a large factor that occupies approximately 10 dB.

Generally, in order to improve the transient response characteristic of the PLL device, increasing the natural frequency $f_n$ is preferred. However, according to the formula (1), when the natural frequency $f_n$ is increased, the cutoff frequency of the loop filter 5 also increases, leading to an expansion of the region where the phase noise caused by the respective equipment inside the above-described PLL device becomes obvious.

Figure 2:
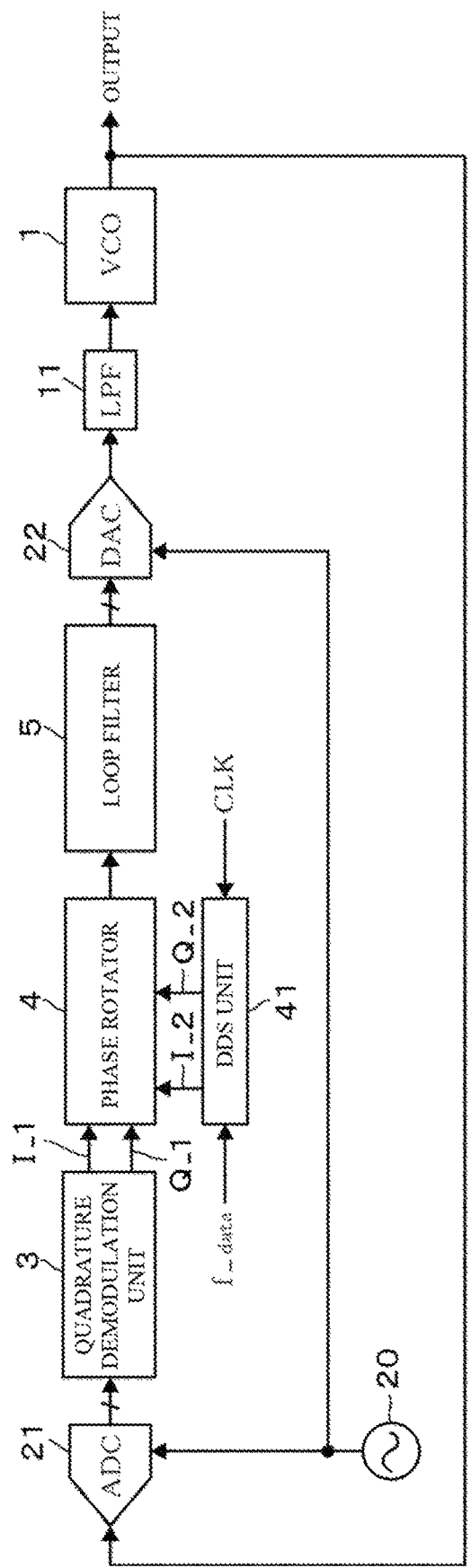
FIG. 2 is a block diagram illustrating a PLL device according to an embodiment.

Then, the PLL device of this embodiment employs a phase comparison method that is less likely to generate the phase noise instead of the conventional phase comparator 63 and charge pump 64 to reduce the phase noise of the output signal. The following describes a configuration of the PLL device according to an embodiment with reference to FIG. 2. In FIG. 2, components common to those described using FIG. 1 are given reference numerals common to those used in FIG. 1.

The PLL device of this example uses an output signal output from the VCO 1 as a feedback signal. As described above, while the frequency divider 61 is not disposed in the example illustrated in FIG. 2 to reduce the phase noise generated at the frequency divider 61, the frequency divider 61 may be disposed as necessary to use a frequency division signal as the feedback signal.

The feedback signal is input into an analog/digital converter (ADC) 21 to be converted into a digital feedback signal. The reference signal source 20 serves as an operation clock for operating the ADC 21. Here, since an operation clock that operates the ADC 21 determines a phase noise characteristic in a region near a carrier frequency, it is preferred to use the operation clock having a phase noise characteristic as good as that of the reference signal used for the phase comparison in the conventional PLL device described using FIG. 1.

In this regard, it is preferred to use the operation clock having the phase noise lower than the output signal by 40 to 70 dBc/Hz in a range of 100 Hz to 10 kHz of a frequency offset when a center frequency of the operation clock is converted so as to correspond to the carrier frequency.

Even when an under-sampling in which the frequency of the operation clock is equal to or less than twice the set frequency (carrier frequency) of the output signal is performed, the characteristic of the phase noise does not deteriorate. However, it is required to identify a position where a folding frequency appears and confirm that the folding frequency appears at a position where it can be removed in an LPF 11 in a latter stage.

The feedback signal digitalized at the ADC 21 is quadrature-demodulated at a quadrature demodulation unit 3, and a process for obtaining an in-phase component (I component; I_1) and a quadrature-phase component (Q component; Q_1) is performed. For example, the quadrature demodulation unit 3 is configured by a Hilbert filter, outputs the digital feedback signal directly as the I component, and outputs a signal obtained by performing a Hilbert transformation on the feedback signal to advance the phase by 90° as the Q component.

Since arithmetic processing is simple with the Hilbert filter, increase in latency in association with the arithmetic processing can be reduced. Reducing the latency to be small can suppress the increase in the phase noise even when a loop bandwidth of the loop filter 5 is widened.

Note that the quadrature demodulation unit 3 is not limited to the case of constituting by the Hilbert filter. For example, using a predetermined frequency signal and a frequency signal having a phase that is advanced by 90° from this frequency signal, a quadrature detection of the digital feedback signal is performed to extract the I component and the Q component.

On the IQ components (IQ_1=(I_1, Q_1)) of the feedback signal output from the quadrature demodulation unit 3, a calculation is performed to obtain phase differences from an I component (I_2) and a Q component (Q_2) of a comparison signal output from a direct digital synthesizer (DDS) unit 41. A case where a digital circuit of this PLL device including the DDS unit 41 is configured by, for example, a field-programmable gate array (FPGA) can be exemplified. At this time, the operation clock of the FPGA (operation clock of the DDS unit 41) has no constraint pertaining to the phase noise characteristic as long as the operation clock can normally operate the FPGA.

Into the DDS unit 41, setting data (f data) obtained from a set frequency of the VCO 1 and a frequency of the operation clock of the DDS unit 41 is input. The DDS unit 41 reads amplitude data stored in a table (not illustrated) based on this setting data and outputs the I component (I_2) of the comparison signal having the set frequency. This DDS unit 41 is configured to output the Q component (Q_2) having a phase that is advanced by 90° from the I component in parallel. The DDS unit 41 corresponds to a comparison signal output unit of this example.

Note that, when the feedback signal is divided at the frequency divider 61, the DDS unit 41 outputs the I component and the Q component of the comparison signal having a frequency obtained by dividing the set frequency by a dividing number N.

A phase rotator 4 performs multiplication of the IQ_1= (I_1, Q_1) of the feedback signal obtained from the quadrature demodulation unit 3 and a conjugate number IQ_2'= (I_2, −Q_2) of the IQ_2=(I_2, Q_2) of the comparison signal obtained from the DDS unit 41 to obtain $e(j\omega 1 t) \times e(-\omega 2 t) = e(j(\omega 1 - \omega 2)t)$. Here, $\omega 1$ and $\omega 2$ are angular velocities of the feedback signal and the comparison signal, respectively.

When the phase difference between the feedback signal and the comparison signal is sufficiently small, this phase difference $((\omega 1 - \omega 2)t)$ is approximately equal to a value of a Q component (defined as a "Q_3") of the multiplication value. Then, the phase rotator 4 outputs the Q_3 as the phase difference between the feedback signal and the comparison signal to the loop filter 5.

The loop filter 5 outputs a digital control voltage value corresponding to the phase difference Q_3 obtained at the phase rotator 4, and a digital/analog converter (DAC) 22 converts this control voltage value into an analog form to make a control voltage. Here, for a reason similar to the ADC 21, it is preferred to use an operation clock of the DAC 22 having a phase noise characteristic as good as that of the reference signal.

The LPF 11 removes high frequency components including the folding frequency generated in the case where the under-sampling has been performed at the ADC 21 from the analog-converted control voltage, and supplies it as the control voltage to the VCO 1.

With the PLL device according to the embodiment including the above-described configuration, as illustrated with a thick solid line in FIG. 3, the characteristic in the region where the phase noise of the conventional PLL device illustrated with the dashed line becomes approximately constant can be improved. Note that among the characteristic improvements, an improvement in association with not including the frequency divider 61 that is disposed in the conventional PLL device corresponds to "20 log (10 N), N is the dividing number" as described above. Additionally, except for a hum/spurious (unnecessary spurious response in a low frequency region) near 300 Hz, there are three spurious responses at equal to or less than 90 dBc, which shows an excellent spurious characteristic.

With the PLL device that includes the above-described configuration, by comparing the I component and the Q component of the digital feedback signal obtained from the output signal of the VCO 1 with the I component and the Q component of the digital comparison signal having the frequency corresponding to the set frequency of the output signal to obtain the phase difference of these signals, the phase noise of the output signal can be reduced.

Here, while FIG. 2 illustrates the example of the PLL device where the DAC 22 is arranged in the latter stage of the loop filter 5, the arrangement of these equipment 5 and 22 may be interchanged.

That is, the configuration may be configured as follows. The phase difference Q_3 obtained at the phase rotator 4 is converted into an analog form at the DAC 22. Next, the loop filter 5 outputs a control voltage corresponding to an analog phase difference and supplies it toward the VCO 1.

Thus, the phase noise of the equipment constituting the PLL device becomes low. Accordingly, even when the natural frequency $f_n$ is set to be high and the cutoff frequency of the loop filter 5 is configured to be high to improve the transient response characteristic of the PLL device, deterioration in the phase noise characteristic can be reduced.

Additionally, a PLL device of another embodiment includes a voltage control oscillation unit, an analog/digital converter, a quadrature demodulation unit, a comparison signal output unit, a phase difference detection unit, a digital/analog converter, and a loop filter. The voltage control oscillation unit oscillates an analog output signal having a frequency corresponding to a control voltage. The analog/digital converter converts the output signal or a frequency division signal obtained by dividing the output signal by a preset dividing number into a digital form as a feedback signal. The quadrature demodulation unit quadrature-demodulates the digital feedback signal to obtain an in-phase component (I component) and a quadrature-phase component (Q component). The comparison signal output unit outputs an I component and a Q component of a digital comparison signal. The digital comparison signal has a set frequency of the output signal when the feedback signal is the output signal and has a frequency obtained by dividing the set frequency by the dividing number when the feedback signal is the frequency division signal. The phase difference detection unit obtains a phase difference between the digital feedback signal and the digital comparison signal based on the I component and the Q component of the digital feedback signal and the I component and the Q component of the digital comparison signal. The digital/analog converter performs a digital-to-analog conversion on the phase difference obtained at the phase difference detection unit. The loop filter supplies a control voltage value corresponding to the analog-converted phase difference to the voltage control oscillation unit.

Each of the above-described PLL devices may include the following configurations.

(a) Each of the PLL devices includes an operation clock supply unit that supplies an operation clock to the analog/digital converter, and uses a frequency signal that has a lower noise than a noise of the output signal as the operation clock supplied from the operation clock supply unit. The operation clock supply unit supplies a common operation clock to the analog/digital converter and the digital/analog converter.

(b) The quadrature demodulation unit includes a Hilbert filter that performs a Hilbert transformation on a digital feedback signal to obtain the Q component.

(c) The comparison signal output unit is a DDS that outputs an amplitude of the comparison signal as the I component and outputs an amplitude of a frequency signal having a phase deviated by 90° from this comparison signal as the Q component.

With the embodiment, the I component and the Q component of the digital feedback signal obtained from the output signal from the voltage control oscillation unit is compared with the I component and the Q component of the digital comparison signal having a frequency corresponding to the set frequency of the output signal to obtain the phase difference of these signals, and this can reduce the phase noise of the output signal.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A PLL device comprising:
   a voltage control oscillation unit that oscillates an output signal in an analog form which has a frequency corresponding to a control voltage;
   an analog/digital converter that converts the output signal or a frequency division signal obtained by dividing the output signal by a preset dividing number as a feedback signal into a digital feedback signal;
   a quadrature demodulation unit that quadrature-demodulates the digital feedback signal to obtain an in-phase component that is an I component and a quadrature-phase component that is a Q component;
   a comparison signal output unit that outputs an I component and a Q component of a digital comparison signal, the digital comparison signal having a set frequency of the output signal when the feedback signal is the output signal and having a frequency obtained by dividing the set frequency by the dividing number when the feedback signal is the frequency division signal;
   a phase difference detection unit that obtains a phase difference between the digital feedback signal and the digital comparison signal based on the I component and the Q component of the digital feedback signal and the I component and the Q component of the digital comparison signal;
   a loop filter that outputs a control voltage value corresponding to the phase difference obtained at the phase difference detection unit; and
   a digital/analog converter that performs a digital-to-analog conversion on the control voltage value obtained at the loop filter and supplies an analog-converted value as a control voltage to the voltage control oscillation unit.

2. The PLL device according to claim 1, further comprising:
   an operation clock supply unit that supplies an operation clock to the analog/digital converter and uses a frequency signal that has a lower noise than a noise of the output signal as the operation clock supplied from the operation clock supply unit.

3. The PLL device according to claim 2, wherein
   the operation clock supply unit supplies a common operation clock to the analog/digital converter and the digital/analog converter.

4. The PLL device according to claim 1, wherein
   the quadrature demodulation unit includes a Hilbert filter that performs a Hilbert transformation on the digital feedback signal to obtain the Q component.

5. The PLL device according to claim 1, wherein
   the comparison signal output unit is a DDS that outputs an amplitude of the digital comparison signal as the I component and outputs an amplitude of a frequency signal having a phase deviated by 90° from the digital comparison signal as the Q component.

6. A PLL device comprising:
   a voltage control oscillation unit that oscillates an output signal in an analog form which has a frequency corresponding to a control voltage;
   an analog/digital converter that converts the output signal or a frequency division signal obtained by dividing the output signal by a preset dividing number as a feedback signal into a digital feedback signal;
   a quadrature demodulation unit that quadrature-demodulates the digital feedback signal to obtain an in-phase component that is an I component and a quadrature-phase component that is a Q component;
   a comparison signal output unit that outputs an I component and a Q component of a digital comparison signal, the digital comparison signal having a set frequency of the output signal when the feedback signal is the output signal and having a frequency obtained by dividing the set frequency by the dividing number when the feedback signal is the frequency division signal;
   a phase difference detection unit that obtains a phase difference between the digital feedback signal and the digital comparison signal based on the I component and the Q component of the digital feedback signal and the I component and the Q component of the digital comparison signal;
   a digital/analog converter that performs a digital-to-analog conversion on the phase difference obtained at the phase difference detection unit; and
   a loop filter that supplies a control voltage value corresponding to an analog-converted phase difference to the voltage control oscillation unit.

7. The PLL device according to claim 6, further comprising:
   an operation clock supply unit that supplies an operation clock to the analog/digital converter and uses a frequency signal that has a lower noise than a noise of the output signal as the operation clock supplied from the operation clock supply unit.

8. The PLL device according to claim 7, wherein
   the operation clock supply unit supplies a common operation clock to the analog/digital converter and the digital/analog converter.

9. The PLL device according to claim 6, wherein
   the quadrature demodulation unit includes a Hilbert filter that performs a Hilbert transformation on the digital feedback signal to obtain the Q component.

10. The PLL device according to claim 6, wherein
    the comparison signal output unit is a DDS that outputs an amplitude of the digital comparison signal as the I component and outputs an amplitude of a frequency signal having a phase deviated by 90° from the digital comparison signal as the Q component.

* * * * *